United States Patent
Chetlur et al.

(10) Patent No.: US 6,576,522 B2
(45) Date of Patent: Jun. 10, 2003

(54) METHODS FOR DEUTERIUM SINTERING

(75) Inventors: Sundar Srinivasan Chetlur, Singapore (SG); Pradip Kumar Roy, Orlando, FL (US); Minesh Amrat Patel, Orlando, FL (US); Sidhartha Sen, Singapore (SG); Vivek Saxena, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 31 days.

(21) Appl. No.: 09/733,570

(22) Filed: Dec. 8, 2000

(65) Prior Publication Data

US 2002/0072187 A1 Jun. 13, 2002

(Under 37 CFR 1.47)

(51) Int. Cl.$^7$ .............................. H01L 21/336
(52) U.S. Cl. .................. 438/359; 438/660; 438/795
(58) Field of Search ............... 438/660, 662, 438/663, 918, 38, 659, 783, 308, 667, 677, 475, 795

(56) References Cited

U.S. PATENT DOCUMENTS

| | | |
|---|---|---|
| 3,849,204 A | 11/1974 | Fowler |
| 3,923,559 A | 12/1975 | Sinha |
| 4,113,514 A | 9/1978 | Pankove et al. |
| 4,151,007 A | 4/1979 | Levinstein et al. |
| 4,268,321 A | 5/1981 | Meguro |
| 4,268,951 A | 5/1981 | Elliot |
| 4,620,211 A | 10/1986 | Baliga et al. |
| 5,248,348 A | 9/1993 | Miyachi et al. |
| 5,264,724 A | 11/1993 | Brown et al. |
| 5,304,830 A | 4/1994 | Sato |
| 5,378,541 A | 1/1995 | Ihara et al. |
| 5,642,014 A | 6/1997 | Hillenius |
| 5,711,998 A | 1/1998 | Shufflebotham |
| 5,830,575 A | 11/1998 | Warren et al. |
| 5,872,387 A | 2/1999 | Lyding et al. |
| 6,023,093 A | 2/2000 | Gregor et al. |
| 6,071,751 A * | 6/2000 | Wallace et al. ............... 438/38 |
| 6,262,485 B1 * | 7/2001 | Thakur et al. ............. 257/757 |
| 6,281,110 B1 * | 8/2001 | Kizilyalli et al. .......... 438/622 |
| 6,342,446 B1 * | 1/2002 | Smith et al. ................ 438/687 |
| 6,436,799 B1 * | 8/2002 | Ramkumar et al. ......... 438/530 |

FOREIGN PATENT DOCUMENTS

WO     WO 94/19829     9/1994

OTHER PUBLICATIONS

Jinju Lee, et al. "Application of high pressure deuterium annealing for improving the hot carrier reliability of CMOS transistors"IEEE Electron Device Letters, Col. 21, No. 5(May 2000).*

Jinju Lee, et al. "The effect of deuterium passivation at different steps of CMOS processing on lifetime iprovements of CMOS transistors", IEEE Transactions on electron devices, vol. 46, No. 8 (Aug. 1999).*

N. Saks and R. Rendell, "The time–dependence of post–irradiation interface trap build–up in deuterium annealed oxides," IEEE Trans. Nucl. Sci., vol. 39, pp. 2220–2229, Dec. 1992.

(List continued on next page.)

Primary Examiner—Caridad Everhart

(57) ABSTRACT

A method for deuterium sintering to improve the hot carrier aging of an integrated circuit includes (a) providing a partially fabricated integrated circuit structure comprising a semiconductor substrate and a dielectric layer formed on at least a portion of the substrate, the dielectric layer having at least one conductive material via plug formed therein and (b) sintering the structure in the presence of a gas comprising deuterium-containing components at high temperatures prior to a metallization layer being deposited on the structure.

9 Claims, 1 Drawing Sheet

OTHER PUBLICATIONS

Ohji, Y., Nishioka, Y., Yokogawa, K., Mukai, K., Hitachi Ltd., Qiu, Q., Arai, E., and Sugano, T., "The Effects of Minute Impurities (H, OH, F) on the SiO2/Si Interface Investigated by Nuclear Resonant Reaction Spin Resonance," IEEE Trans. Elect. Dev., vol. 37, pp. 1635–1542, Jul. 1990.

Sze, S.M., Physics of Semiconductor Devices, 2nd Edition, John Wiley, 1981, pp. 850–853.

Kizilyalli et al., Deuterium Post–Meial Annealing of MOSFET's for Improved Hot Carrier Reliability, IEEE Electron Device Letters, vol. 18, No. 3, (Mar. 1997) pp. 81–83.

* cited by examiner ated circuits, e.g., CMOS and biCMOS processes, are disclosed herein. More particularly, methods for deuterium sintering at high temperatures prior to depositing a metallization layer on a partially fabricated integrated circuit are disclosed.

METHODS FOR DEUTERIUM SINTERING

BACKGROUND

1. Technical Field

Methods for deuterium sintering in fabricating integrated circuits, e.g., CMOS and biCMOS processes, are disclosed herein. More particularly, methods for deuterium sintering at high temperatures prior to depositing a metallization layer on a partially fabricated integrated circuit are disclosed.

2. Background of Related Art

Performance degradation of semiconductor devices that occurs with time, which is often referred to as the hot carrier (electron or hole) degradation effect, is well known. It is believed that this efficiency degradation is caused by defects that are generated by the current flow through the device. It is believed that these defect states reduce the mobility and lifetime of the carriers and cause degradation in performance of the device.

In most cases, the device includes at least a substrate comprised of silicon and a dielectric layer deposited on at least a portion of the substrate to form substrate/dielectric interfaces and the defects are thought to be caused by dangling bonds (i.e., unsaturated silicon bonds) that introduce states in the energy gap, which remove charge carriers or add unwanted charge carriers in the device, depending in part on the applied bias. While dangling bonds occur primarily at surfaces or interfaces in the device, they also are thought to occur at vacancies, micropores, dislocations, and are also thought to be associated with impurities. To alleviate the problems caused by such dangling bonds, a hydrogen passivation process has been adopted and has become a well-known and established practice in the fabrication of such devices. See, e.g., U.S. Pat. Nos. 3,849,204; 3,923,559; 4,113,514; 4,151,007; and 5,711,998.

In the hydrogen passivation process, it is thought that the defects that affect the operation of semiconductor devices are removed when hydrogen bonds with the silicon at the dangling bond sites. While hydrogen passivation eliminates the immediate problem associated with these dangling bonds, it does not eliminate degradation permanently. Rather, hydrogen atoms added by the passivation process can be "desorbed" or removed from the previous dangling bond sites by radiation or by the "hot carrier effect."

In general, a hot carrier is an electron or hole that obtains a high kinetic energy when voltages are applied to the electrodes of the device. Under such operating conditions, the hydrogen atoms, which were added by the hydrogen passivation process, are knocked off by the hot electrons. This results in aging or degradation of the device's performance. According to established theory, this aging process occurs as the result of hot carriers stimulating the desorption of hydrogen from the surface of the silicon substrate or the $SiO_2$ interface. While dangling bonds occur primarily at the surfaces or interfaces in the device, they are also believed to occur at vacancies, micropores, dislocations and also to be associated with impurities.

This hot carrier effect is particularly of concern with respect to smaller devices in which proportionally larger voltages are used. When such high voltages are used, channel carriers can degrade device behavior. For example, in silicon-based P-channel MOSFETs, channel strength can be reduced by trapped energetic holes in the oxide which lead to a positive oxide charge near the drain. On the other hand, in N-channel MOSFETs, gate-2-drain shorts may be caused by electrons entering the oxide and creating interface traps and oxide wear-out. "Drain engineering" has been an emerging field attempting to cope with these problems, for example involving the use of a lightly-doped drain (LDD) in which a lightly-doped extension of the drain is created between the channel and the drain proper. Such solutions are, however, expensive because they typically complicate the fabrication process. Their avoidance, or at least their simplification, would be desirable.

One approach used to address the above-discussed hot carrier aging problem involves employing, in lieu of hydrogen, an isotope of hydrogen, e.g., deuterium, to passivate the substrate/dielectric interfaces. However, passivation with deuterium instead of hydrogen will typically occur at the back end of the semiconductor device fabrication process, that is, after the metallization layer is deposited on at least the dielectric layers formed on the semiconductor substrate. See, e.g., U.S. Pat. No. 6,071,751. One problem associated with this passivation process is that since deuterium is a larger molecule than hydrogen, it does not diffuse rapidly through the dielectric layers thereby resulting in substantially no hot carrier aging improvement. As a result, any excess hydrogen in the various dielectric layers redistributes thus achieving mainly hydrogen passivation of the substrate/dielectric interfaces.

It would be advantageous to introduce hydrogen isotopes, such as, for example, deuterium, at the front end of the semiconductor device fabrication process, i.e., before formation of a metallization layer, by introducing the isotopes into a partially fabricated semiconductor structure containing at least a semiconductor substrate and a dielectric layer formed on a portion of the substrate to form substrate/dielectric interfaces wherein the dielectric layer contains at least one conductive material via plug formed therein to provide improved hot carrier aging in the resulting semiconductor device.

SUMMARY

A novel method in fabricating an integrated circuit employing a front end deuterium sintering step has been discovered. The method includes at least providing a partially fabricated integrated circuit structure having a top surface, the structure comprising a semiconductor substrate and a dielectric layer formed on at least a portion of the substrate, the dielectric layer having at least one conductive material via plug formed therein; and, sintering the structure in the presence of a fluid comprising deuterium-containing components prior to a metallization layer being deposited on the structure. Optionally, the deuterium sintered structure can be quenched and then subjected to a back end deuterium sintering step.

In a particularly useful embodiment, the method includes the steps of:

a) providing a partially fabricated integrated circuit structure having a top surface, the structure comprising a semiconductor substrate and a dielectric layer formed on at least a portion of the substrate, the dielectric layer having at least one conductive material via plug formed therein;

b) sintering the structure in the presence of a first fluid comprising deuterium-containing components at a first temperature prior to a metallization layer being deposited on the structure;

c) depositing at least a metallization layer on at least a portion of the sintered structure; and, d) sintering the structure in the presence of a second fluid comprising deuterium-containing components at a second temperature.

Methods of the invention and devices formed therefrom provide unique advantages in the field of semiconductor devices, their preparation and their use. For example, the resulting device demonstrates improved operational characteristics and resist aging or "depassivation" due to hot-carrier effects. Moreover, the resulting devices formed from the methods of the invention can be operated using higher voltages to increase performance, while better resisting degradation due to hot-carrier effects. Likewise, methods of the invention are beneficial for preparing radiation hard devices, which are usually operated at higher voltages. Further, methods of the invention can be readily and economically practiced and incorporated into existing fabrication techniques, and may eliminate the need for costly and/or complicated measures otherwise taken to guard against hot electron effects, for example, lightly doped drain (LDD) technology, or provide more processing flexibility in the conduct of such measure.

BRIEF DESCRIPTION OF THE DRAWINGS

A preferred embodiment of the method disclosed herein is described below with reference to the drawing wherein.

DESCRIPTION OF THE PREFERRED EMBODIMENTS

In accordance with the methods described herein, an integrated circuit having improved hot carrier aging resulting in extended performance of the circuit can be produced. Specifically, employing a deuterium sintering step prior to depositing a metallization layer on a partially fabricated integrated circuit structure containing at least a semiconductor substrate and a dielectric layer formed on at least a portion of the substrate, the dielectric layer having at least one conductive material via plug formed therein significantly improves the hot carrier aging of the resulting integrated circuit, i.e., an integrated circuit having an improved hot carrier aging by a factor of about 5 to about 35 times and preferably by a factor of about 10 to about 30 times compared to a similar integrated circuit containing substantially the same structure with deuterium sintering being carried out following a metallization layer being deposited on the structure. Thus, sintering with deuterium provides a reduction in the passivation or "aging" of semiconductor by, for example, substantial degradations of threshold voltage, transconductance, or other device characteristics.

In accordance with the present invention, deuterium is advantageously contacted with semiconductor substrate/dielectric interfaces of a partially fabricated integrated circuit structure prior to a metallization layer being formed on the structure by employing a deuterium sintering step in the front end of the semiconductor device fabrication process to condition the devices and stably reduce the extent of these degradations. This can be accomplished by, for example, disposing molecular ($D_2$), atomic ($°D$) or ionic ($D^+$) deuterium-containing components in the areas of the device in which protection against hot carrier effects is desired, and causing the deuterium to covalently bond with atoms in the area so as to be stably incorporated, for example, bonding to atoms of silicon. Thus, it is to be understood that the deuterium-containing components in accordance with the invention will typically contain an enhanced amount of deuterium that is at a level in excess above that which occurs in nature, and above that which occurs as a low-level impurity in other supplied fluids, e.g., purified hydrogen gas which is presently used in hydrogen passivation processes for semiconductors.

Figure 1:
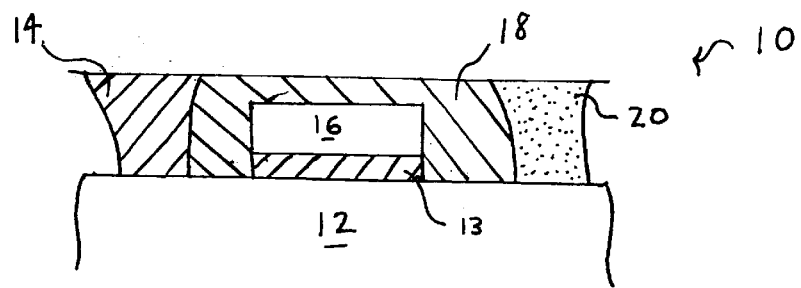
FIG. 1 is a schematic cross-sectional view of a partially fabricated integrated circuit structure containing a semiconductor substrate and a dielectric layer having at least one conductive material via plug formed therein; and, FIG. 2 is a schematic cross-sectional view of the sintered structure of FIG. 1 having a metallization layer deposited on the top surface of the structure.

Referring to FIG. 1, the method involves providing a partially fabricated integrated circuit structure 10. In general, structure 10 will include at least a semiconductor substrate 12 having a gate oxide layer 13 formed on at least a portion of substrate 12. Semiconductor substrate 12 used in the method described herein is of the conventional type and may contain, for example, circuitry and other interconnection levels. The substrate 12 may comprise silicon, germanium, gallium arsenide or other presently known or later-discovered materials that are suitable for the manufacture of such semiconductor devices with silicon being preferred for use herein. The structure can also include a barrier layer 14 formed on at least a portion of substrate 12, a gate 16 formed over the gate oxide layer 13 and a dielectric layer 18 formed over gate 16 and on at least a portion of substrate 12. Suitable materials for the material layers 13, 14 and 18 can include any conventional materials known to one skilled in the art. Preferred materials include, but are not limited to, $SiO_2$, ceramic, sapphire, polyimides and the like for gate oxide layer 13, Ti/TiN for barrier layer 14 and $SiO_2$ for dielectric layer 16. Techniques and parameters for forming layers 13, 14 and 18 and gate 16 on substrate 12 (e.g., chemical vapor deposition, physical vapor deposition, time, temperature, thickness, etc.) are within the purview of one skilled in the art.

Conductive material via plugs 20 can be formed in dielectric layer 18 by techniques known to those skilled in the art. For example, a resist layer (not shown) can be applied to the top surface of the dielectric layer 18. The resist layer is patterned and developed using known photolithographic techniques. Then etching is conducted to form via openings by, such as, employing a suitable anisotropic etching technique, e.g., reactive ion etching. The etching is continued for a time sufficient to etch through dielectric layer 18 to the top surface of each barrier layer 13. A desired width of each via opening will normally vary according to the current-carrying requirements for a given conductor.

A conductive material is then deposited within and fills each via opening to form the conductive material via plugs. The conductive material can be deposited by any known or conventional procedure, for example, by selective chemical vapor depositions (CVD's). Any conventional conductive material can be used herein. Suitable materials include, but are not limited to, W, Al, Cu, Pd and the like and combinations thereof with W being preferred. The top surface of structure 10 will normally be substantially planarized. If necessary, a separate planarization step such as, for example, CMP can be employed.

Next, a deuterium sinter is performed on the top surface of partially fabricated integrated circuit structure 10. Generally, the substrate/dielectric interfaces will be treated with deuterium-containing components by, for example, sintering the substrate/dielectric interfaces with a fluid such as a deuterium-enriched gas at high temperatures employing sintering techniques known in the art, e.g., heating the substrate in a vertical furnace and contacting the substrate/dielectric interfaces with the deuterium-enriched gas. The sintering can advantageously be conducted at high temperatures, e.g., temperature above about 450° C. and preferably between about 450° C. to about 600° C., prior to a metallization layer being deposited on the top surface of structure 10. Generally, deuterium-enriched gases will contain from about 0.1% to about 100% by volume deuterium gas. While the deuterium-enriched gas will preferably be substantially free of oxygen, one or more other conventional gases useful in or not deleterious to the annealing process such as inert gases, e.g., nitrogen, helium, argon and the like, can be employed with deuterium in an amount of, for example, 10% deuterium and 90% nitrogen. The substrate will ordinarily be subjected to the sintering step for a time period, e.g., from about 1 minute to about 5 hours, sufficient to introduce deuterium to the substrate/dielectric interface to achieve a high concentration therein, e.g., from about 80 percent to about 100 percent of the Si—H bonds being replaced by Si—D bonds.

If desired, the deuterium sintered structure can be rapidly quenched by, for example, nitrogen quenching to allow the deuterium to substantially remain at the substrate/dielectric interface . The quenching is typically carried out to reduce the temperature at a rate of about 35° C. per minute. Else, the deuterium sintered structure can be cooled at room temperature to reduce the temperature at a rate of about 2.5 to about 3° C. per minute. Although some benefit may occur from slower cooling rates faster cooling is preferred.

Generally, by employing the deuterium sintering and optional rapid quench steps prior to depositing a metallization layer on structure 12, there will be no reduction in the thickness of the metallization layer formed on the top surface of structure 10, which is described hereinbelow . Additionally, a high concentration of deuterium near the semiconductor substrate/dielectric interfaces is achieved thus reducing the amount of hydrogen near the interface. Therefore, the number of deuterium atoms exceeds the number of hydrogen bonds near the interface resulting in a greater amount of Si—D bonds compared to Si—H bonds.

Figure 2:
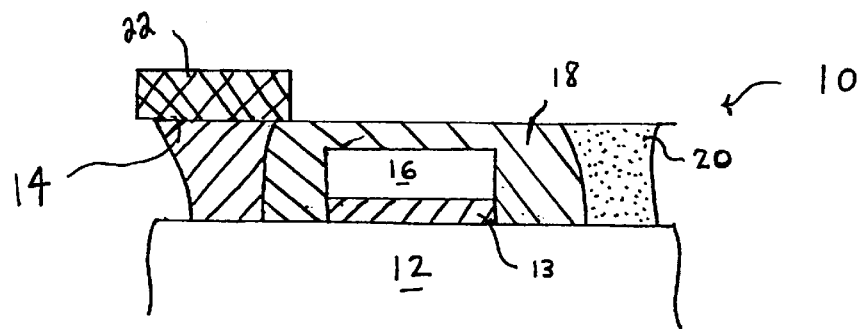

Following sintering and/or optional quenching of the sintered structure, other layers can be deposited on the top surface thereof as generally depicted in FIG. 2. For example, a first metallization layer 22 can be deposited on at least a portion of the top surface of structure 10, followed by a second dielectric layer 24 on at least the top surface of metallization layer 22 and the top surface of structure 10 with additional layers, e.g., dielectric layers, barrier layers, additional metallization layers, being formed thereon (not shown). The dielectric layer 24 can be further processed to form via openings therein which can be filled with conductive materials as described above. Materials for forming these layers can be any suitable material known to one skilled in the art for each layer. Also, techniques and parameters (e.g., time, temperature, thickness, etc) for forming these layers are within the purview of one skilled in the art.

However, by further processing structure 10, small amounts of deuterium may migrate away from the semiconductor substrate/dielectric interface. Accordingly, it may be advantageous to carry out a second deuterium sintering to redistribute the deuterium to the interface. Thus, the partially fabricated device will be treated with deuterium-containing components by, for example, sintering the substrate/dielectric interfaces with a second deuterium-enriched fluid employing sintering techniques known in the art and discussed above with respect to the first sintering step. The sintering can advantageously be conducted at a temperature lower than the temperature utilized in the first deuterium sintering step. The temperatures will ordinarily range from about 300° C. to about 550° C. and preferably from about 400° C. to about 500° C. Generally, deuterium-enriched gases will contain from about 0.1% to about 100% by volume deuterium gas. While the deuterium-enriched gas will preferably be substantially free of oxygen, one or more other gases useful in or not deleterious to the annealing process such as, for example, inert gases such as nitrogen, helium, argon and the like, can be employed with deuterium as discussed above. The substrate will ordinarily be subjected to the sintering step for a time period, e.g., from about 1 minute to about 5 hours, sufficient to introduce deuterium to the substrate/dielectric interface to achieve a high concentration therein.

If desired, the sintered structure can then be rapidly quenched to lower the temperature of this structure. The quenching mediums and rates of cooling described above with respect to the first quenching step apply equally to the second quenching step.

Additional conventional processing steps can then be performed to further complete fabrication of the integrated circuit. Integrated circuits to be formed herein include, e.g., standard NMOS transistor formation, PMOS devices, biCMOS processes, CMOS processes, floating-gate memory cells, smart power processes, power DMOS processes, etc. For example, the disclosed process can be advantageous with flash memories which use hot-carrier programmation. It is particularly advantageous to employ the process disclosed herein for fabricating sub-0.25 $\mu$m CMOS and BiCMOS devices.

Although the method disclosed herein has been described in its preferred form with a certain degree of particularity, obviously many changes and variations are possible therein and will be apparent to those skilled in the art after reading the foregoing description. It is therefore to be understood that the present method may be presented otherwise than as specifically described herein without departing from the spirit and scope thereof.

What is claimed is:

1. A method for fabricating an integrated circuit to improve the hot carrier aging of the circuit comprising:
    a) providing a partially fabricated integrated circuit structure having a top surface, the structure comprising a semiconductor substrate and a dielectric layer formed on at least a portion of the substrate, the dielectric layer having at least one conductive material via plug formed therein; and,
    b) sintering the structure in the presence of a first fluid comprising deuterium-containing components at a first temperature prior to depositing a metallization layer on the structure whereby deuterium diffuses into interfaces between the semiconductor substrate and the dielectric layer said interfaces having a ratio of Si—D bonds to Si—H bonds of at least about 8:1.

2. The method of claim 1 wherein the substrate is selected from the group consisting of silicon, germanium and gallium arsenide.

3. The method of claim 1 wherein the dielectric comprises is silicon.

4. The method of claim 1 wherein the conductive material via plug is formed from a material selected from the group consisting of W, Al, Cu, Pd and combinations thereof.

5. The method of claim 1 wherein the first temperature is from about 450° C. to about 600° C.

6. The method of claim 1 further comprising the step of quenching the sintered structure to reduce the temperature of the structure at a rate of about 35° C. per minute.

7. The method of claim 1 further comprising the steps of:
    c) depositing at least a metallization layer on at least a portion of the top surface of the structure; and, d) sintering the structure in the presence of a second fluid comprising deuterium-containing components at a second temperature.

8. The method of claim 7 wherein the second temperature is from about 300° C. to about 550° C.

9. The method of claim 7 further comprising the step of quenching the sintered structure to reduce the temperature of the structure at a rate of about 35° C. per minute.

* * * * *